US006411246B2

(12) United States Patent
Nagaraj

(10) Patent No.: US 6,411,246 B2
(45) Date of Patent: Jun. 25, 2002

(54) FOLDING CIRCUIT AND A/D CONVERTER

(75) Inventor: Krishnaswamy Nagaraj, Somerville, NJ (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/739,188

(22) Filed: Dec. 18, 2000

Related U.S. Application Data

(60) Provisional application No. 60/171,463, filed on Dec. 22, 1999.

(51) Int. Cl.[7] .................................................. H03M 1/34

(52) U.S. Cl. ........................ 341/158; 341/155; 341/156; 341/157; 341/159; 341/160

(58) Field of Search ................................ 341/133, 136, 341/155, 156, 157, 158, 159, 160

(56) References Cited

U.S. PATENT DOCUMENTS 4,831,379 A * 5/1989 Vorenkamp et al. ........ 341/158
5,751,236 A * 5/1998 Vorenkamps et al. ....... 341/155

* cited by examiner

*Primary Examiner*—Michael Tokar
*Assistant Examiner*—Lam T. Mai
(74) *Attorney, Agent, or Firm*—W. Daniel Swayze, Jr.; W. James Brady; Frederick J. Telecky, Jr.

(57) ABSTRACT

A folding circuit is provided for outputting a periodic function representative of an analog input signal. The circuit includes at least two preamplifiers and a third differential amplifier circuit coupled to the preamplifier circuits for providing a bias current such that the flow of current is regulated through one of the preamplifier circuits at any given time, thereby providing a periodic function representative of an analog input signal.

6 Claims, 4 Drawing Sheets

300
310
320
410
420
430
412
414
422
424
432
434
442
444
450
460
470
V_DD
V_in
V_ref1
V_ref5
V_mid
V_B1
V_B2
V_0
R_1
R_2
M_1
M_2
M_3
M_4
M_5
M_6
M_7
M_8
I

FOLDING CIRCUIT AND A/D CONVERTER

This application claims priority from provisional application Ser. No. 60/171,463, filed Dec. 22, 1999.

BACKGROUND OF THE INVENTION

So-called "folding" analog-to-digital converters (ADC's) are well known in the art. Folding ADC's convert analog signals to corresponding digital signals by generating an output signal that is typically a piecewise-linear periodic function of an input signal. The output of such a device is therefore "folded" and can have a substantially smaller dynamic range than its corresponding input signal. As a consequence, a folding ADC is preferred over conventional "flash" or parallel converters in that the folded waveform can be digitized utilizing substantially fewer comparators. A folding ADC therefore consumes less power and is also useful for high speed data communication and storage applications.

SUMMARY OF THE INVENTION

The limitations and inadequacies of conventional folding analog-to-digital converters (ADC's) are substantially overcome by the present invention, in which a principal object is to provide a folding analog-to-digital converter (ADC) having a minimal number of voltage comparators.

Still another object of the present invention to provide a folding ADC characterized by low power consumption and which outputs a periodic function representative of an analog input signal.

Yet another object of the present invention to provide a folding ADC for use in high speed data communication and storage applications.

Accordingly, an electronic circuit is provided having: a first differential amplifier circuit having a first reference voltage; a second differential amplifier circuit coupled to the first differential amplifier circuit, the second differential amplifier circuit can a second reference voltage; and a resistive network coupled to the first having a second differential amplifier circuits.

In addition, the electronic circuit is provided having a third differential amplifier circuit coupled to the first and second differential amplifier circuits for regulating the flow of current through one of the differential amplifier circuits at any given time, such that the periodic function has a first zero-crossing when the voltage of the analog input signal equals the first reference voltage and a second zero-crossing when the voltage of the analog input signal equals the second reference voltage.

Further objects, features and advantages of the invention will become apparent from the following detailed description taken in conjunction with the accompanying figures showing illustrative embodiments of the invention.

BRIEF DESCRIPTION OF THE DRAWINGS

For a complete understanding of the present invention and the advantages thereof, reference is now made to the following description taken in conjunction with the accompanying drawings in which like reference numbers indicate like features and wherein.

DETAILED DESCRIPTION OF THE INVENTION

Figure 1:
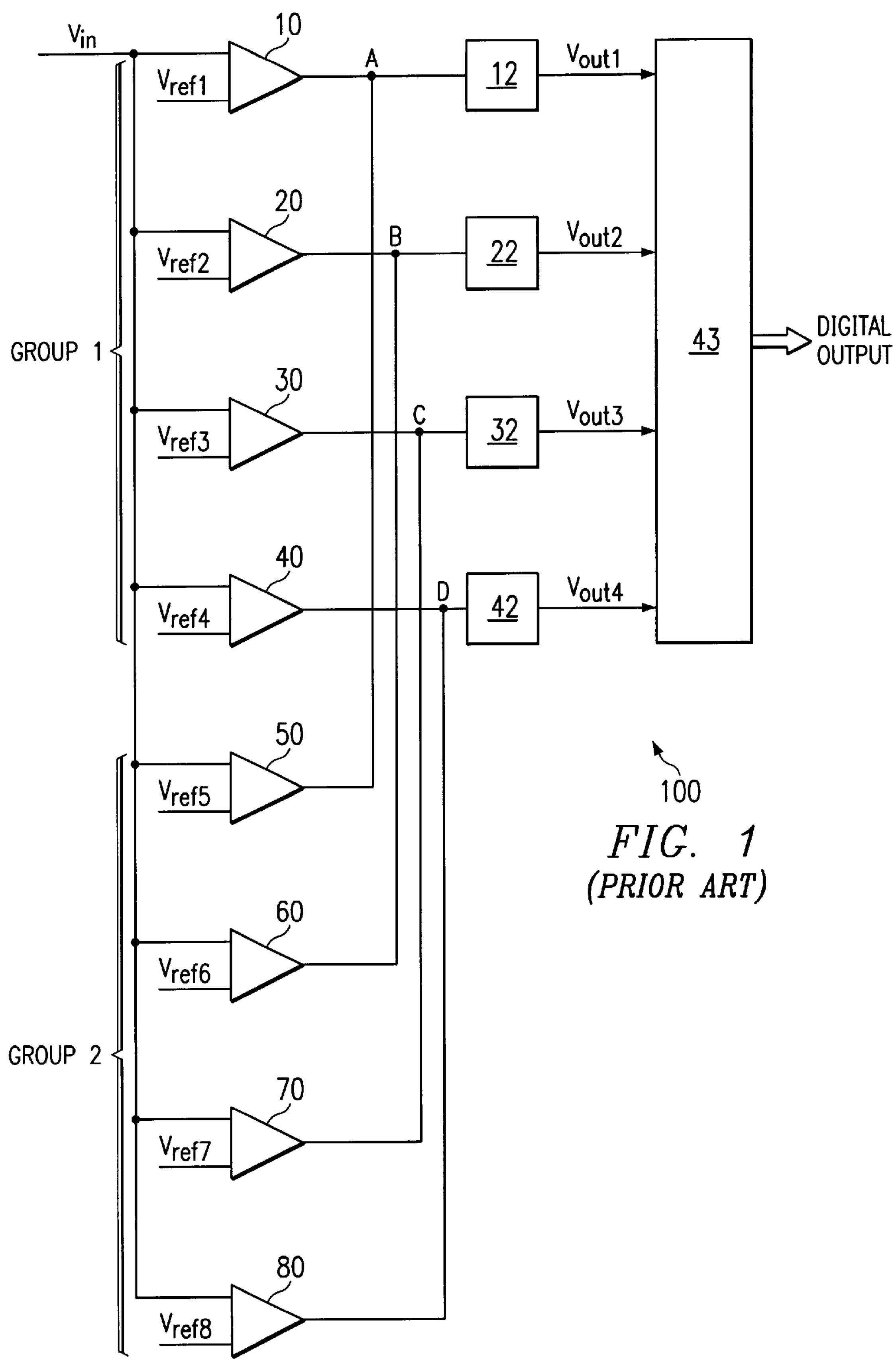
FIG. 1 is a circuit schematic of a conventional folding ADC.
Figure 2:
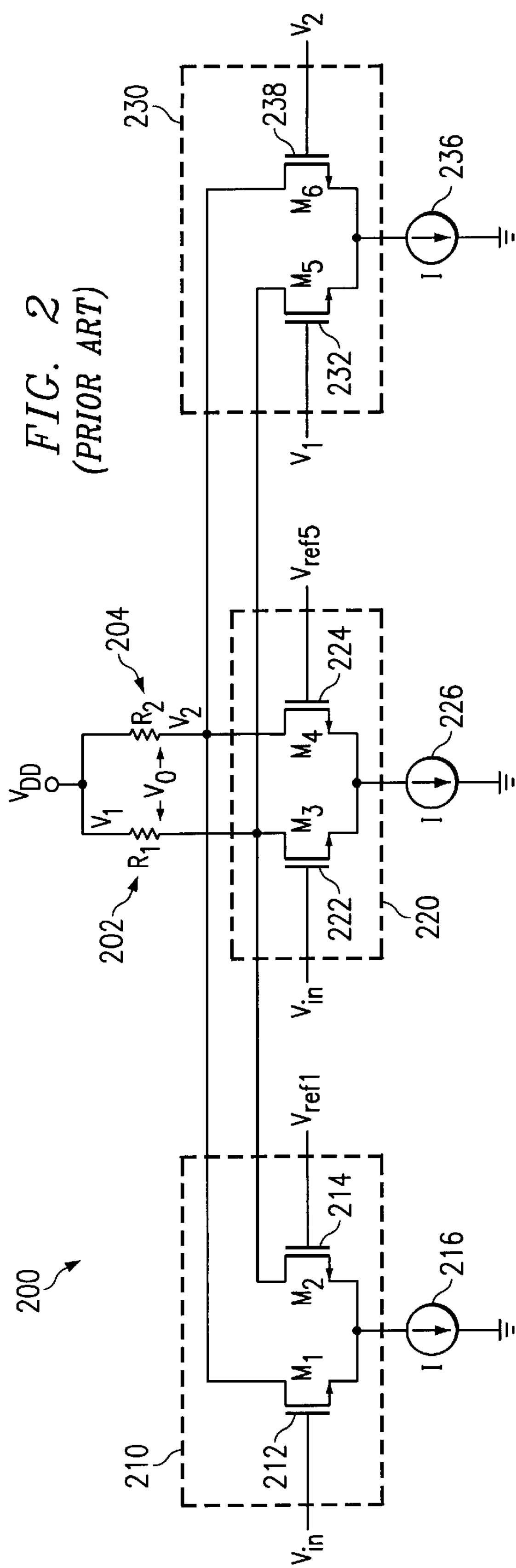
FIG. 2 is a circuit schematic of a folding stage for the conventional ADC of FIG. 1.

FIGS. 1 and 2 are prior art figures and are discussed below to better set forth and describe the analog-to-digital converter (ADC) of the present invention.

FIG. 1 shows a circuit schematic of a conventional folding ADC 100. The ADC 100 of FIG. 1 is a conventional 3-bit folding ADC converter having eight input preamplifiers 10 through 80 divided into 2 groups, e.g., 1 through 4 and 5 through 8. Each of the outputs from the first (upper) group of pre-amplifiers 10 through 40 are connected to a corresponding output of a pre-amplifier from the second (lower) group of pre-amplifiers 50 through 80. The pre-amplifiers 10 through 80 are designed so that each combination produces a zero crossing at nodes A through D whenever the input Vin crosses the corresponding reference levels Vref1 through Vref8 of either of the two pre-amplifiers that are connected together. Each combination is then connected to a corresponding latch, latches 12, 22, 32 and 42, and the corresponding logic low or logic high outputs Vout1 through Vout4 are generated. Thus, only four latches are required to perform an 8-bit encoding of the analog input signal Vin. The outputs, Vout1 through Vout4, are then provided to an encoder 43, which in turn generates a digital output representation of the analog input Vin.

Figure 3:
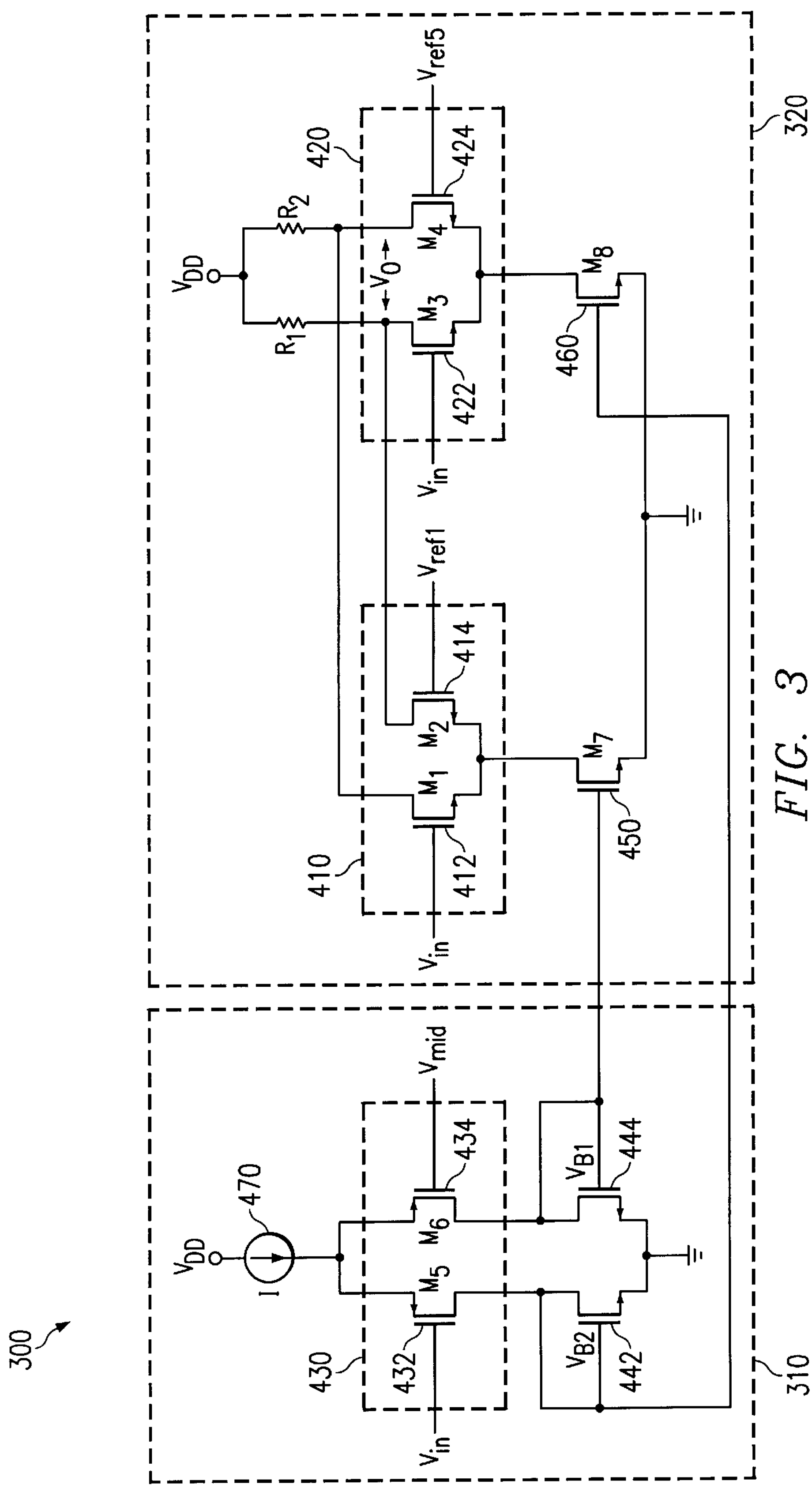
FIG. 3 is a circuit schematic of a folding stage according to the present invention.

FIG. 2 shows a folding analog-to-digital circuit or "folding stage" 200 for the conventional folding ADC of FIG. 1. The folding stage 200 is configured, by way of example and not limitation, to combine the outputs of two signals generated with respect to a first and fifth reference voltages, Vref1 and Vref5, as shown in FIG. 1. Referring again to FIG. 2, the folding stage 200 includes three differential pairs 210 through 230. Transistor $M_5$ is biased by a constant input $V_1$ and the transistor $M_6$ is biased by a constant input V2 such that all of the tail current I from current source 236 flows through the n-MOS transistor device $M_6$. The operation of this folding stage is as follows. When Vin is less than $Vref_5$, then $M_3$ is shut-off, $M_5$ is turned on, $M_1$ is shut-off, and $M_2$ is turned-on. Thus, a current I flows through $R_1$ and a current 2I flows through $R_2$ yielding a voltage $V_o$=IR as shown in FIG. 3. As $V_{in}$ increases, $V_o$ exhibits two zero crossings, one in the vicinity of Vref5 and one in the vicinity of Vref1.

The folding stage of FIG. 2 however has several disadvantages. First, the circuit of FIG. 2 is characterized by high power consumption and dissipation, i.e., a total current of 3I is always required. Second, because there are three differential pairs connected to output, the net output impedance is reduced, thus decreasing the achievable voltage gain at the output of the device. Also, for the same reason, the net load capacitance is increased, thus reducing the speed of operation of the device.

FIG. 3 is a circuit schematic of a folding circuit or stage 300 in accordance with an embodiment of the present invention. The folding stage 300 again is configured to combine the outputs of two signals generated with respect to a first and fifth reference voltages, Vref1 and Vref5. Referring again to FIG. 3, the folding circuit 300 according to the present invention includes a first differential pair 410, a second differential pair 420 coupled to the first differential pair 410 and two resistors R1 and R2 coupled to both the first and second differential pairs. The first and second differential pairs 410 and 420 represent one of the four pre-amplifiers pairs shown in FIG. 4, e.g., pre-amplifiers 10 and 30. The resistors R1 and R2 are preferably equal in value and also coupled to a source signal VDD. As known and understood by those of skill in the art, the nominal values for the resistors R1 and R2 and the source signal VDD depend on the specific application of the circuit. Although R1 and R2 are shown as passive loads, in practice they are both active loads that are used to increase the output resistance at $V_o$.

Figure 4:
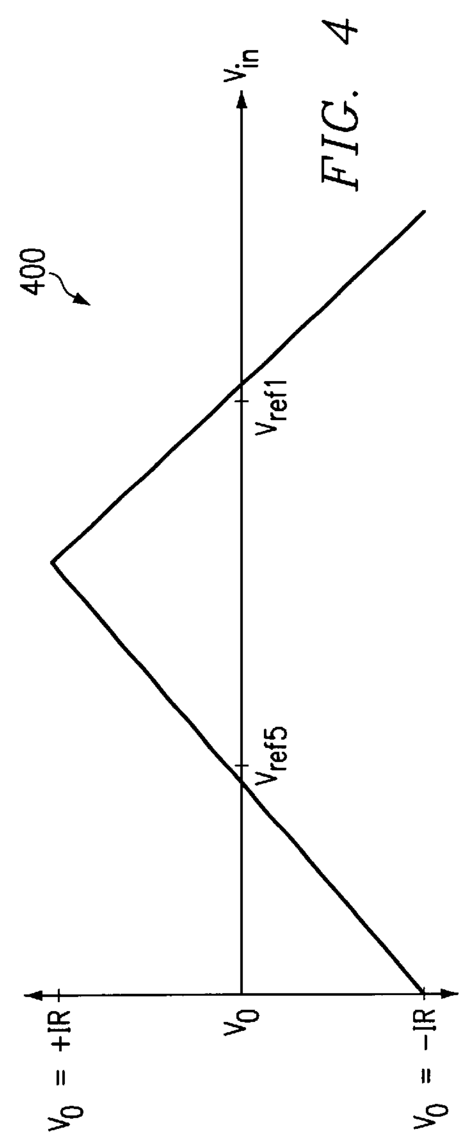
FIG. 4 is a graph showing the input and output voltage characteristics of the folding stage of FIG. 3.

As shown in FIG. 3, the folding circuit 300 includes only two differential pairs 410 and 420 connected to the output $V_o$. A third p-channel differential pair 430 is coupled to a single current source 470 and is used to generate bias currents for the two main differential pairs 410 and 420. The reference voltage for the p-channel differential pair is called a midlevel voltage Vmid. The value of Vmid can be any value between the reference voltages for the main differential pairs 410 and 420, Vref1 and Vref5, respectively, as shown in FIG. 4.

Referring again to FIG. 3, the folding stage 300 of the present invention operates as follows. When $V_{in}$ is in the vicinity of Vref5 (which is defined as a voltage less the Vmid), the p-channel transistor (MS) 432 carries the entire bias current I. This biases the tail current of the differential pair (M3 and M4) 422/424 to I, and the tail current of the differential pair (M1 and M2) 412/414 to zero. Thus, $V_o$ is characterized by a zero crossing when $V_{in}$, crosses the Vref 5.

Similarly, when $V_{in}$ is above the mid-level voltage Vmid, the p-channel transistor (M6) 434 carries all the bias current I, thus setting the tail current of the differential pair (M1 and M2) 412/414 equal to I, and the tail current of the differential pair (M3 and M4) 422/424 equal to zero. Thus, when $V_{in}$ crosses Vref1, $V_o$ again exhibits a zero crossing.

The folding circuit of FIG. 3 thus has the advantage that at any given time only one of the two input differential pairs 410 or 420 is conducting. This reduces the current consumed and yields a relatively higher output resistance and a lower load capacitance than conventional folding ADC's. Further, the p-channel differential pair 430 can be shared by several folding stages, and if the mid-level voltage is set to be between Vref 4 and Vref 5, a single p-channel pair can serve all the folding stages of an 3-bit ADC.

Figure 5:
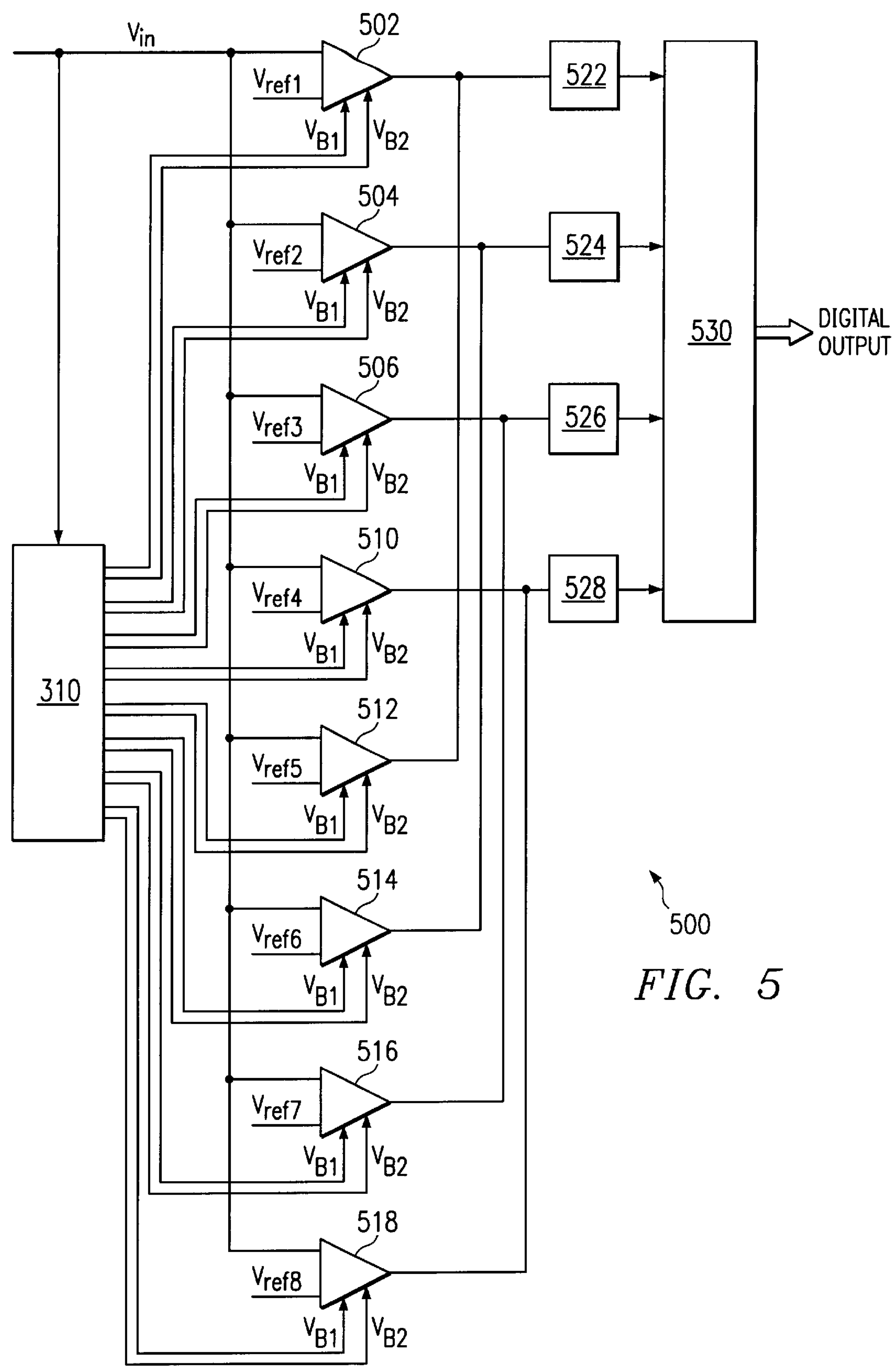
FIG. 5 is a circuit schematic of a folding ADC according to the present invention.

FIG. 5 is a circuit schematic of a folding ADC utilizing the folding circuit 300 of FIG. 3. Each folding stage (corresponding to 320 in FIG. 3) is formed by a pair of differential amplifiers 502/512, 504/514, 506/516 and 508/518. The bias current of these folding stages are controlled by the bias circuit 508 in FIG. 3. This consists of one or more p-channel differential pairs (corresponding to 508 in FIG. 3). If $V_{mid}$ is chosen precisely to be between Vref4 and Vref5, then a single p-channel differential pair can be "shared" by all of the folding stages 502/512, 504/514, 506/516 and 508/518. Alternatively, a separate p-channel differential pair 508 can be provided for each folding stage 502/512, 504/514, 506/516 and 508/518. Still alternatively, a combination of "shared" circuits and individually assigned circuits can be provided.

Although the present invention has been described in connection with particular embodiments thereof, it is to be understood that such embodiments are susceptible of modification and variation without departing from the inventive concept disclosed. All such modifications and variations, therefore, are intended to be included within the spirit and scope of the appended claims.

What is claimed is:

1. A folding circuit for outputting a periodic function representative of an analog input signal, said circuit comprising:

a first differential amplifier circuit having a first reference voltage;

a second differential amplifier circuit coupled to said first differential amplifier circuit, said second differential amplifier circuit having a second reference voltage;

a resistive network coupled to said first and second differential amplifier circuits; and a third differential amplifier circuit coupled to said first and second differential amplifier circuits for regulating the flow of current through one of said differential amplifier circuits at any given time, such that the periodic function has a first zero-crossing when the voltage of said analog input signal equals said first reference voltage and a second zero-crossing when the voltage of said analog input signal equals said second reference voltage.

2. A folding circuit according to claim 1, further comprising a latch electrically connected to said circuit.

3. A folding circuit according to claim 1, wherein said third differential amplifier circuit comprises a pair of p-channel transistors, and a current source.

4. A folding circuit according to claim 2, wherein said third differential amplifier circuit comprises a pair of p-channel transistors, and a current source.

5. A folding circuit for outputting a periodic function representative of an analog input signal, said circuit comprising:

a plurality of pre-amplifiers comprising:

(1) a first differential amplifier circuit having a first reference voltage;

(2) a second differential amplifier circuit coupled to said first differential amplifier circuit, said second differential amplifier circuit having a second reference voltage; and (3) a resistive network coupled to said first and second differential amplifier circuits;

a third differential amplifier circuit coupled to said plurality of pre-amplifiers for regulating the flow of current through one of said differential amplifier circuits at any given time, such that the periodic function has a first zero-crossing when the voltage of said analog input signal equals said first reference voltage and a second zero-crossing when the voltage of said analog input signal equals said second reference voltage; and a plurality of latches electrically connected to corresponding pre-amplifiers.

6. A folding circuit according to claim 5, wherein said third differential amplifier circuit comprises a pair of p-channel transistors, and a current source.

* * * * *